US005626715A

United States Patent [19]
Rostoker

[11] Patent Number: 5,626,715
[45] Date of Patent: May 6, 1997

[54] METHODS OF POLISHING SEMICONDUCTOR SUBSTRATES

[75] Inventor: Michael D. Rostoker, San Jose, Calif.

[73] Assignee: LSI Logic Corporation, Milpitas, Calif.

[21] Appl. No.: 542,284

[22] Filed: Oct. 12, 1995

Related U.S. Application Data

[63] Continuation of Ser. No. 14,432, Feb. 5, 1993, abandoned.

[51] Int. Cl.⁶ .............................. H01L 21/00; B24B 1/00
[52] U.S. Cl. ..................... 438/4; 438/693; 438/633
[58] Field of Search .................... 156/636.1, 645.1; 216/89; 106/3; 51/308

[56] References Cited

U.S. PATENT DOCUMENTS

| | | | |
|---|---|---|---|
| 4,671,851 | 6/1987 | Beyer et al. | 156/645.1 |
| 4,910,155 | 3/1990 | Cote et al. | 156/636.1 X |
| 4,944,836 | 7/1990 | Beyer et al. | 156/645.1 |
| 4,956,025 | 9/1990 | Okajima et al. | 106/3 |
| 4,956,313 | 9/1990 | Cote et al. | 437/228 X |
| 5,128,081 | 7/1992 | Siegel et al. | 264/81 |
| 5,142,828 | 9/1992 | Curry, II | 51/281 R |

FOREIGN PATENT DOCUMENTS

| | | |
|---|---|---|
| 3827893 | 2/1990 | Germany . |
| 03-277683 | 12/1991 | Japan . |

*Primary Examiner*—Thi Dang
*Attorney, Agent, or Firm*—Katz & Cotton, LLP

[57] ABSTRACT

Methods of polishing, particularly chem-mech polishing a semiconductor substrate to planarize a layer, to remove excess material from atop a layer, and to strip back a defective layer are disclosed. Aluminum oxide particles having a small, well controlled size, and substantially in the alpha phase provide beneficial results when polishing.

19 Claims, 4 Drawing Sheets

METHODS OF POLISHING SEMICONDUCTOR SUBSTRATES

This is a continuation of U.S. patent application Ser. No. 08/014,432, filed Feb. 5, 1993, now abandoned by Michael D. Rostoker.

TECHNICAL FIELD OF THE INVENTION

The present invention relates to processing steps in the fabrication or re-fabrication (e.g., repair) of semiconductor devices and, more particularly, to the partial or complete polishing (stripping away) of layers previously deposited on the semiconductor device.

BACKGROUND OF THE INVENTION

Semiconductor devices are fabricated step-by-step, beginning with a silicon wafer (substrate), implanting various ions, creating various circuit structures and elements, and depositing various insulating and conductive layers. Some of these layers are subsequently patterned by photoresist and etching, or similar processes, which results in topological features on the surface of the substrate. Subsequent layers over the topological layers inherit, and sometimes exacerbate, the uneven topology of the underlying layers. Such uneven (irregular, non-planar) surface topology can cause undesirable effects and/or difficulties in the application of subsequent layers and fabrication processes.

Hence, it is known, at various stages of semiconductor fabrication, to planarize a layer. Various techniques for planarizing a layer by etching or chemical-mechanical ("chem-mech") polishing are known. For example, chem-mech polishing of a semiconductor substrate is disclosed in U.S. Pat. Nos. 4,671,851, 4,910,155 and 4,944,836, incorporated by reference herein.

The present invention is directed to chem-mech polishing processes, which generally involve "rubbing" a wafer with a polishing pad in a slurry containing both an abrasive and chemicals. Typical slurry chemistry is KOH (Potassium Hydroxide), having a pH of about 11. A typical silica-based slurry is "SC-1" available from Cabot Industries. Another slurry based on silica and cerium (oxide) is Rodel "WS-2000".

It is also known to use mechanical or chem-mech polishing techniques to completely remove (rather than to partially remove, or planarize) a layer that has been deposited. For example, U.S. Pat. No. 5,142,828, incorporated by reference herein, describes a process whereby a defective metallization layer is removed from the top of an electronic component such as an integrated circuit or a copper/polyimide substrate by polishing with a rotating pad and a slurry. Non-defective underlying metallization layers are preserved, and a new metallization layer is fabricated to replace the defective layer. For example, mechanical polishing of a copper layer, in a customizable high density copper/polyimide substrate, using a slurry of alumina grit with alumina particles between 0.05–3.0 microns suspended in solution, is disclosed in this patent. Slurries using silicon carbide and diamond paste are also described in the patent. The polishing of a tungsten layer is also suggested in the patent.

The aforementioned U.S. Pat. No. 4,910,155 discloses wafer flood polishing, and discusses polishing using 0.06 micron alumina particles in deionized water. The use of silica particulates is also discussed. Particulates of sizes as small as 0.006 microns (average size), and as large as 0.02 microns are discussed in this patent. The use of $SiO_2$ particulates (average diameter of 0.02 microns) suspended in water is also discussed in this patent.

Generally, chem-mech polishing is known for planarizing dielectric films. Generally, the penultimate layers of an integrated circuit are alternating dielectric and conductive layers forming interconnects, and the ultimate layer is a passivation layer, such as phosphosilicate glass (PSG). It is generally inconvenient and impractical to check the device at each step in the process since 1) functionally, the various gates and structures may not be interconnected at a particular stage, and 2) it is generally undesirable to remove the wafer from the "clean" fabrication environment at intermediate steps.

U.S. Pat. No. 4,956,313 discloses a via-filling and planarization technique. This patent discusses a planarization etch to remove portions of a metal layer lying outside of vias, while simultaneously planarizing a passivation layer, to provide a planarized surface upon which subsequent metal and insulator layers can be deposited. The use of an abrasive slurry consisting of $Al_2O_3$ particulates, de-ionized water, a base, and an oxidizing agent (e.g., hydrogen peroxide) is discussed, for etching tungsten and BPSG.

In the process of manufacturing semiconductor devices from silicon wafers, there is always the possibility that the device (or entire wafer) will be mis-manufactured. For example, a top metal layer ($M_n$) may exhibit voids reducing the cross-sectional area of conductive lines. Various other problems such as corrosion, mechanical stress and incomplete etching may be encountered. In the main hereinafter, voids in metal lines are discussed as an exemplary fault needing repair. Reference is made to "*Stress Related Failures Causing Open Metallization*, by Groothuis and Schroen, *IEEE/IRPS*, 1987, CH2388-7/87/0000–0001, pp.1–7, incorporated by reference herein.

Once a fault is identified, it can sometimes be repaired, and techniques such as focussed ion beam "micro-surgery" are known. However, in order to advantageously employ these repair techniques, or to remanufacture a defective layer it is necessary to strip off one or more of the top layers (e.g., passivation, metal, dielectric) of the device. These stripping techniques have as their goal returning the device (or a plurality of devices, when an entire wafer is processed in this manner) to a pre-existent, incomplete stage of manufacture, from which point onward, the device can be repaired or remanufactured.

Wet etching is one known technique for removing (stripping) layers of material in semiconductor devices. However, wet etching cannot be made to etch in any way except isotropically, which means that structures will be distorted in the horizontal (lateral) extent. Further, wet etching of oxide can destroy metal lines and bond pads.

Plasma etching, on the other hand, can be either isotropic or anisotropic, but it is usually unable to continue etching through all of the layers of material (e.g., oxide removal in the presence of metal lines) in the same cycle. This limitation forces the use of a series of different plasma etch processes, and simply does not work satisfactorily. In many instances, insulating layers underlying metal areas are also etched away, with the result that the metal lines will lift off.

U.S. Pat. No. 4,980,019, entitled ETCH-BACK PROCESS FOR FAILURE ANALYSIS OF INTEGRATED CIRCUITS, (Baerg et al.; Dec. 25, 1990) discloses a method for etching exposed dielectric layer portions of an integrated circuit device to expose an underlying metal layer, by reactive ion etching (RIE) of the passivation layer. The technique is directed to etching back a delidded integrated circuit device.

U.S. Pat. No. 4,609,809, incorporated by reference herein, discloses method and apparatus for correcting delicate wiring of IC device employing an ion beam.

These techniques are unsatisfactory in that they alter the topography of the devices while film (layer) removal is taking place. In other words, they do not return the device to a truly pre-existent stage of fabrication. Consequently, significant losses in device throughput are incurred.

DISCLOSURE OF THE INVENTION

It is therefore an object of the present invention to provide an improved technique for polishing semiconductor devices.

It is a further object of the present invention to provide an improved technique for planarizing layers in semiconductor devices, including removing excess material such as metal overfilling vias.

It is a further object of the present invention to provide an improved technique for polishing back or removing layers in semiconductor devices.

It is a further object of the present invention to provide an improved technique for polishing back or removing layers in a semiconductor device as a prelude to reworking or repairing a defective layer in the device.

It is a further object of the invention to provide a technique for removing top layers of a semiconductor device, without damaging pre-existing topology, returning the wafer, undamaged, to a truly pre-existing state.

It is a further object of the present invention to provide an improved technique for chemical-mechanical ("chem-mech") polishing of semiconductor devices.

It is a further object of the present invention to provide an improved technique for chem-mech planarizing layers in semiconductor devices, including removing excess material such as metal overfilling vias.

It is a further object of the present invention to provide an improved technique for chem-mech polishing back or removing layers in semiconductor devices.

It is a further object of the present invention to provide an improved technique for chem-mech polishing back or removing layers in a semiconductor device as a prelude to reworking or repairing a defective layer in the device.

It is a further object of the invention to provide a technique for removing top layers of a semiconductor device, by chem-mech polishing, without damaging pre-existing topology, returning the wafer, undamaged, to a truly pre-existing state.

According to the invention, a semiconductor wafer is polished using particles of Aluminum Oxide ($Al_2O_3$) or Silica ($SiO_2$). Preferably, the particles are in a colloidal "suspension".

According to a feature of the invention, the Aluminum Oxide particles are preferably "Alpha" ($\alpha$) state, but other forms of Aluminum Oxide (e.g., Gamma state, or pure $Al_2O_3$) may be used.

According to a feature of the invention, the Silica may be amorphous $SiO_2$.

According to a feature of the invention, the size of the particles is on the order of 30–100 nm (nanometers), preferably approximately 50 nm.

According to a feature of the invention, the particles are used in a chemical-mechanical (chem-mech) "slurry", for chem-mech polishing a substrate.

According to a feature of the invention, the particles are used to remove unwanted structures, such as metal layer from a finished or in-process substrate.

According to a feature of the invention, the particles are used to polish polyimid films or CVD TEOS layers.

According to a feature of the invention, the particles are used to planarize a layer or layers of an in-process semiconductor device. Such layer(s) may be dielectric films and/or metal layers, and such planarizing includes removing excess material such as metal overfilling vias.

According to a feature of the invention, the particles are used to remove a layer (or layers) of an in-process or substantially completed semiconductor device. Such layer(s) may be dielectric films and/or metal layers. The removed layer(s) may or may not be re-applied to the semiconductor device (substrate).

Preferably, an entire semiconductor wafer containing a plurality of semiconductor devices is polished with the particles, but individual dies (devices) can also be subjected to polishing with the particles.

According to a feature of the invention, the process of removing material from a semiconductor substrate with the particles is "surface-referenced", and the material removal process can be tailored to produce a resulting substrate surface which is either substantially planar or which is substantially conformal to underlying layers.

According to a feature of the invention, wafers which have been mis-manufactured can be returned to a pre-existing state, for repair (i.e., repair of the defective layer, followed by re-applying the overlying layers) or partial re-manufacture (i.e, re-applying the stripped off defective layer and overlying layers).

The use of the particles for polishing is a very effective way to prepare wafers for repair in the Back-End (BE) process. In this process, wafers are substantially completed, and their value to the manufacturer is maximized. Scrapping the wafers is costly and the loss of time to manufacture replacement wafers is at it's worst. In this case, a polish process can remove dielectric films back to the level of the BPSG reflowed glass layer. This removal can take place at the Metal 1 layer, Interlevel dielectric (ILD), Metal 2 or Passivation Layers. In each case, if the metal is exposed to the polishing slurry, the metal will be removed back to the level of the silicon contacts. In this case, it is most optimal to polish back to the BPSG level.

The use of tungsten plug technology during metallization has certain beneficial effects in connection with the disclosed use of polishing for repair. Tungsten is not particularly attacked by basic polishing slurry. As such, the polish process does not automatically knock the metal level back to the contact level when upper metal levels are exposed to polishing slurry.

Aluminum, on the other hand, such as may be found in metal layers, may be severely attacked by the polishing slurry. Preferably, when polishing an aluminum layer, it is polished back to the contact level, since it is relatively difficult to remove aluminum in a via.

Other objects, features and advantages of the invention will become apparent in light of the following description thereof.

Figure 1A:
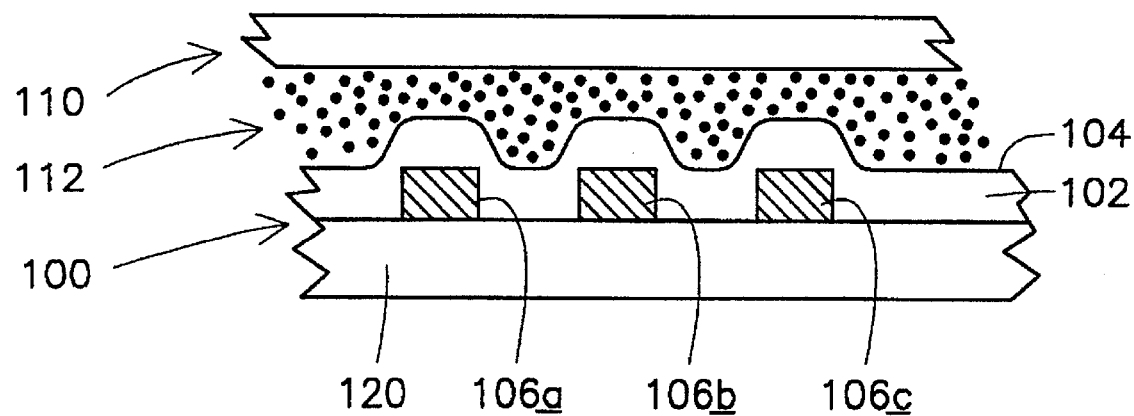
FIG. 1a is a cross-sectional view of a semiconductor device being polished, according to the present invention.

It should be understood that while one semiconductor device may be shown and discussed, or only a particular portion thereof, the present invention is applicable to a plurality of such devices resident on a single silicon wafer.

DETAILED DESCRIPTION OF THE INVENTION

Technological progress is often based on the availability of new and improved materials which enable increasing the performance of new products or new methods of manufacture. For example, the discovery of the class of high temperature superconducting ceramics has given rise to numerous possible new products and new manufacturing methods. Frequently, progress in new material developments arises from the discovery of new chemical compounds or more sophisticated methods of manufacturing products, such as, new methods of miniaturization for use in integrated circuit manufacture.

Recently, methods have been developed for controllably producing ultrafine-grained, or nanocrystalline, materials (typically, about 1–100 nm grain diameters). These new methods have made possible the production of new materials having substantially different physical and chemical properties than the large grained, or single crystal, counterparts having substantially the same chemical composition.

U.S. Pat. No. 5,128,081, incorporated by reference herein, discloses a method of making nanocrystalline alpha alumina, and discusses providing substantially stoichiometric $Al_2O_3$, and discusses providing nanocrystalline materials having selectable grain size. The patent discloses an apparatus for preparation of nanocrystalline or nanophase materials (hereinafter, "nanocrystalline" materials shall include crystalline, quasicrystalline and amorphous phases). The patent discusses the preparation of nanocrystalline aluminum oxide, with a treatment that results in transformation of nanocrystalline aluminum powders (likely with a very thin oxide coating) to the thermodynamically stable alpha phase of aluminum oxide having an average particle size of about 18 nm. The patent discusses forming preferentially alpha alumina nanocrystalline ceramic material having a grain size of less than about 20 nm, and discusses alpha alumina having a median grain size of about 18 nm.

Given the recent advances in methods of producing such nanocrystalline materials, numerous problems in areas such as polishing semiconductor substrates can now be addressed using these new nanocrystalline materials.

According to the invention, aluminum oxide ($Al_2O_3$) particles are used to polish a semiconductor substrate. (Alumina is any of several forms of aluminum "oxide ($Al_2O_3$), occurring naturally as corundum, in a hydrated form in bauxite, and with various impurities such as ruby, sapphire, and emery, and is used in aluminum production and in abrasives, refractories, ceramics, and electrical insulation.)

The aluminum oxide particles are preferentially substantially entirely in the alpha phase. The alpha phase of aluminum oxide is harder than other phases of aluminum oxide, such as the gamma phase.

The aluminum oxide is preferably used in a chem-mech slurry for polishing the semiconductor substrate.

Characteristics of the Polishing Particles

According to the invention, the alpha aluminum oxide particles used for polishing exhibit the following characteristics. Preferably, the particle size is "X" nm, and the distribution of particle sizes is controlled to within "Y" nm, and the particles used for polishing are "Z" percent (%) in the alpha phase, where:

"X" is 10–100 nm, such as 10, 20, 30, 40 or 50 nm, and is preferably no greater than 50 nm; and "Y" is approximately "P" percent of "X", where "P" is 10%, 20%, 30%, 40% or 50%, and is preferably no greater than 50% to ensure a narrow (Gaussian) distribution of particle sizes about "X";

"Z" is at least 50%, including at least 60%, 70%, 80% and 90%, and as high as 100%.

A quality factor "Q" is inversely related to "Y", and is a measure of the distribution of particle sizes. "Q" can be calculated as the concentration of particles at the desired size "X", divided by the range of sizes of particles at 3 db (decibels) lower than "X". Preferably, the size distribution of alpha aluminum oxide particles used for polishing exhibits a "Q" of at least 10, including 10, 50, 100, 500, 1000, 5000, or 10,000 ("Q" is dimensionless).

According to the invention, aluminum oxide particles exhibiting the aforementioned characteristics are used for planarizing a layer of a semiconductor device, such as an interlevel dielectric layer, a polyimide film, or a plasma etched CVD TEOS.

According to the invention, aluminum oxide particles exhibiting the aforementioned characteristics are used for stripping away a top metal layer, which may have been defectively applied to the semiconductor device.

According to the invention, aluminum oxide particles exhibiting the aforementioned characteristics are advantageous for use in polishing semiconductor devices because they can be supplied in a neutral state, then acidified or basefied at will, depending upon the layer to be polished. For maximum performance in polishing thermal oxide, a pH of 10.5 to 11 is desirable. For polishing metals, pH's as low as 3.0 to 3.5 are preferred.

Aluminum oxide exhibiting the aforementioned characteristics is superior to colloidal silica, since acidification of colloidal silica results in flocculation. Aluminum oxide remains in suspension under a wide range of pH's.

For polishing an aluminum layer, it is preferred to acidify aluminum oxide exhibiting the aforementioned characteristics with zinc sulphate. Increased acidification with alum is preferred. Glacial acetic acid is recommended for polishing other materials.

According to the invention, maintaining a high "Q" range of high percentage alpha phase aluminum oxide particles ensures superior polishing. For example, particles significantly larger than "X" tend to scratch the surface being polished, and particles significantly smaller than "X" are less effective in polishing and tend to dilute the slurry with relatively useless material.

In an alternate embodiment of the invention, gamma aluminum oxide is substituted for the alpha aluminum oxide described above.

In yet another embodiment of the invention, a colloidal suspension of amorphous silica is substituted for the alpha aluminum oxide described above.

Polishing to Planarize

FIG. 1a shows an in-process semiconductor device 100 having an layer 102 exhibiting a non-planar top surface 104. For example, the layer 102 is an interlevel dielectric layer (ILD) overlying a metal layer 106 having topological features such as conductive lines 106a, 106b and 106c. Prior to forming vias (not shown) through the ILD layer 102, it is desirable to planarize the top surface 104 of the layer 102. Hence, FIG. 1a shows a polishing pad 110 positioned to planarize the top surface 104 of the layer 102. A medium 112 containing particles (shown as dots "•") of alpha aluminum oxide is interposed between the polishing pad 110 and the top surface 104 of the layer 102. The layers 102 and 104 are formed atop a substrate 120.

Figure 1B:
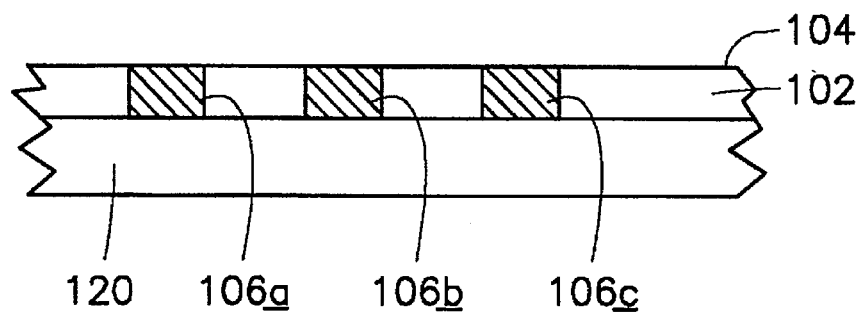
FIG. 1b is a cross-sectional view of the semiconductor device of FIG. 1a, after polishing.

FIG. 1b shows the semiconductor device 100 of FIG. 1a, after polishing. As shown, the top surface 104 of the layer 102 is substantially planar.

Polishing to Remove Excess Material

Figure 2A:
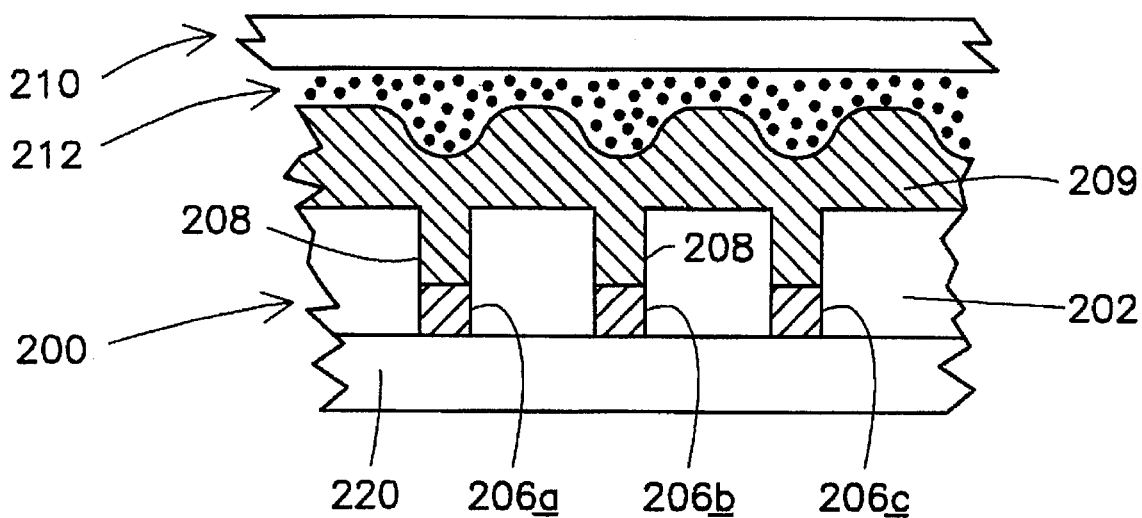
FIG. 2a is a cross-sectional view of a semiconductor device being polished, according to the present invention.

FIG. 2a shows an in-process semiconductor device 200 having a thick interlevel dielectric (ILD) layer 202 overlying a patterned metal layer 206 having conductive lines 206a, 206b and 206c. Vias 208 are formed through the ILD layer 202, in line with selected conductors 206a,b,c. A layer of metal 209 is applied over the ILD 202, to fill the vias 208, for interconnecting the lines 206a,b,c to a subsequent patterned layer of metal (not shown) overlying the ILD 202. At this point, it is desirable to remove the excess metal 209 overfilling the vias 208. Hence, FIG. 2a shows a polishing pad 210 positioned to remove the excess metal, while planarizing the top surface of the in-process substrate 220. A medium 212 containing particles (shown as dots "•") of alpha aluminum oxide is interposed between the polishing pad 210 and the top surface of the layer 209.

Figure 2B:
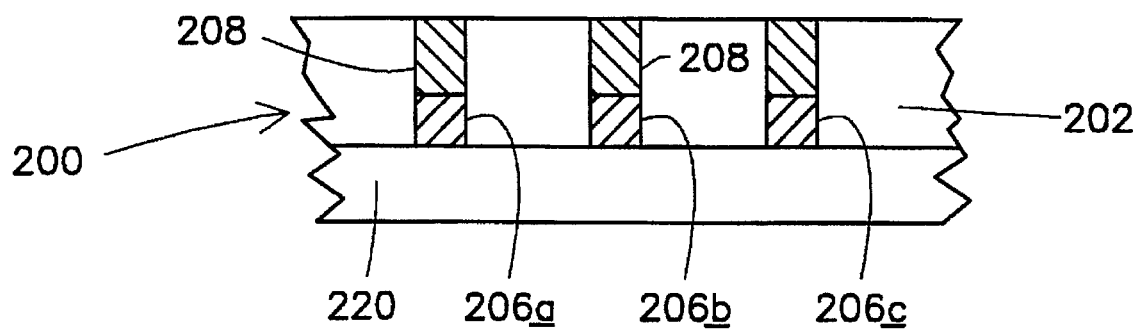
FIG. 2b is a cross-sectional view of the semiconductor device of FIG. 2a, after polishing.

FIG. 2b shows the semiconductor device 200 of FIG. 2a, after polishing. As shown, the top surface of the layer 202 is substantially planar, the vias 208 are perfectly filled with metal 209, and there is no excess metal 209 outside of the vias 208.

Polishing to Strip a Layer

Figure 3:
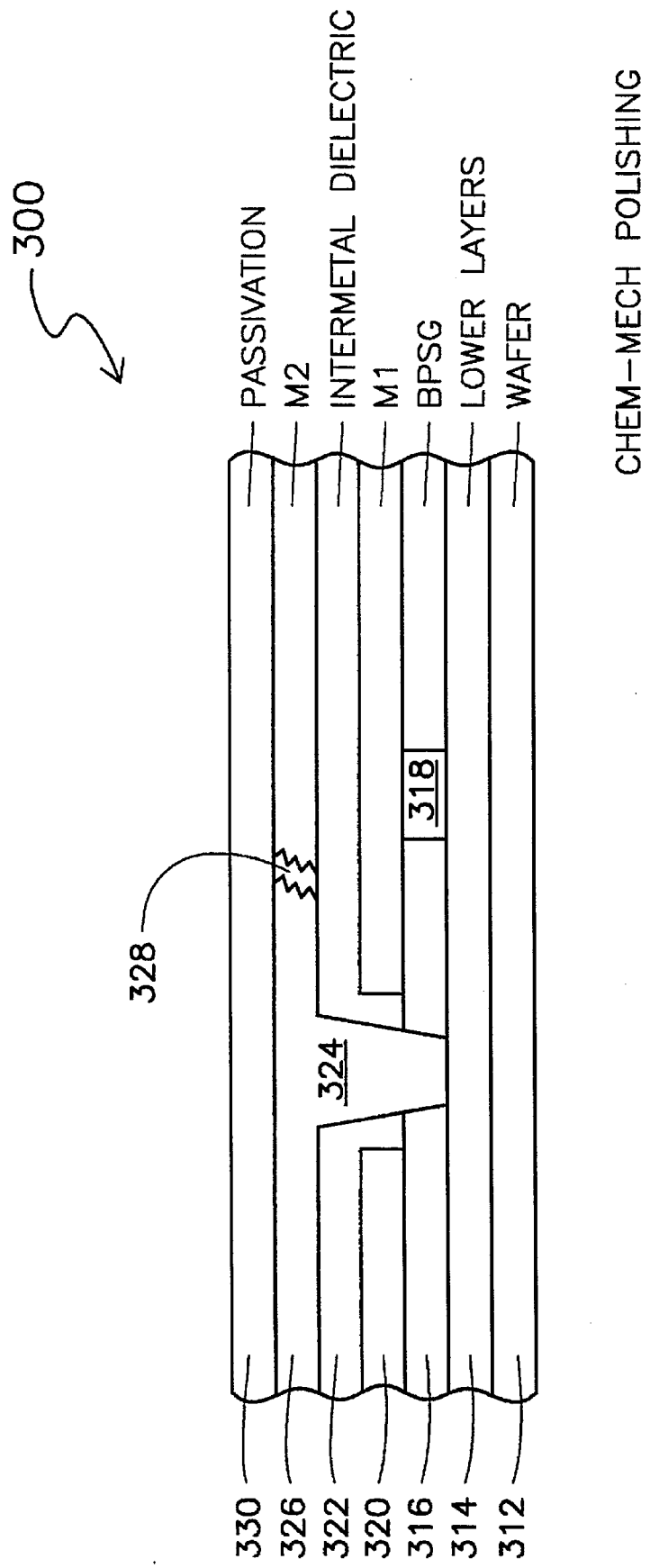
FIG. 3 is a cross-sectional view of a semiconductor device exhibiting a defect, according to the present invention.

FIG. 3 shows an idealized, substantially completed semiconductor device 300 displaying a defect. In this case open (or partially open) metallization will be discussed as a "generic" defect requiring re-working or repair of the device 300.

By way of example, in the fabrication process, the following steps proceed sequentially. First, lower layers 314 are deposited, patterned and the like on a substrate 312. The lower layers include any of a variety of depositions forming circuit structures, contacts and elements, as is known.

Next, by way of example, a layer 316 of Borophosphosilicate glass (BPSG) is deposited, which is a known technique for creating an intermediate planar topology for subsequent metal deposition.

Vias may be formed through the BPSG layer 316 to the lower layers 314, and filled by overlying metal. Alternatively, as shown, a tungsten plug 318 is formed atop the lower layers 314.

Next, a first, patterned metal layer ("M1") 320, formed of aluminum of an aluminum alloy, is deposited, creating a pattern of conductive lines.

Next, an intermetal insulating layer (ILD dielectric film) 322 is deposited. A via 324 is formed through the dielectric film 322 and through the BPSG layer 316 for connection of overlying metal to the lower layers 314.

Next, a second, patterned metal layer ("M2") 326, again formed of aluminum or an aluminum alloy, is deposited, creating a pattern of conductive lines and filling the via 324.

As shown, the second metal layer 326 contains a void 328, which is a manufacturing defect generally undetectable at this stage of manufacturing.

Finally, a passivation layer 330, such as phosphosilicate glass (PSG) is deposited.

The resulting, substantially completed device can now be functionally tested. Such testing is expected to reveal the existence of the defect 328, and having been located and diagnosed, the task remains to strip off the passivation layer 330 and possibly the second metal layer 326 to repair or re-manufacture the second metal layer, respectively. To this end, the device 310 is subjected to chemi-mechanical polishing, as in FIGS. 1a and 2a.

Figure 3A:
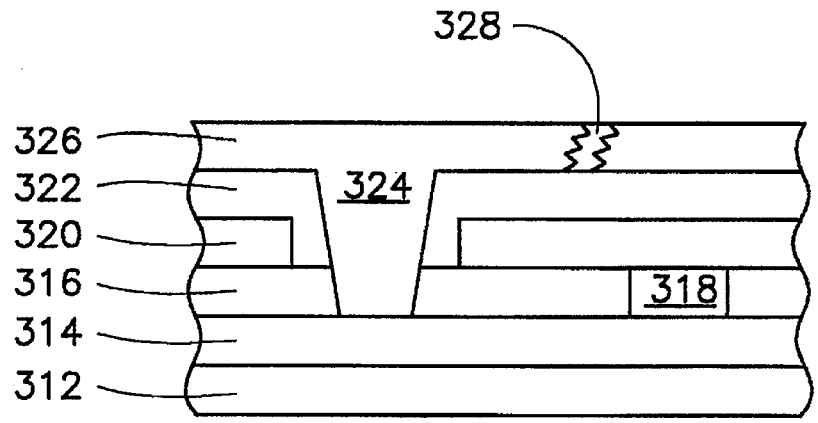
FIG. 3a is a cross-sectional view of the semiconductor device of FIG. 3, after polishing.

FIG. 3a shows the device 300 after polishing, according to one embodiment of the invention. In this embodiment, the passivation layer 330 has been stripped (polished back) to the level of the second metal layer 326. At this point, it is possible to repair the defect 328 using a focussed ion beam, or other suitable repair technique.

Figure 3B:
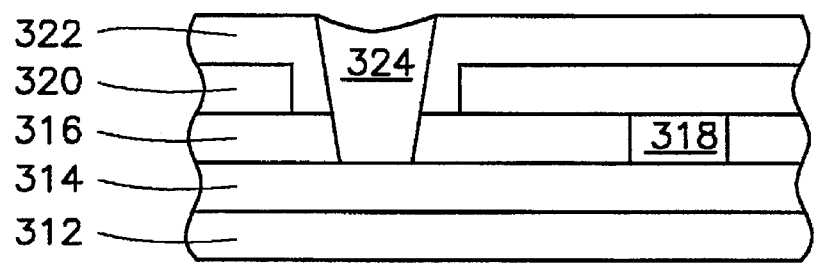
FIG. 3b is a cross-sectional view of the semiconductor device of FIG. 3, after polishing.

FIG. 3b shows the device 300 after polishing, according to another embodiment of the invention. In this embodiment, the passivation layer 330 and the second metal layer 326 have both been stripped (polished back) to the level of the intermetal dielectric film 322. It would be expected that the metal in the via 324 would disappear if it is of the same material (aluminum) as that of the second metal layer 326. If the material in the via 324 is not severely attacked, it is possible to remanufacture (re-deposit) the second metal layer (including any material removed from the via 324) and the passivation layer.

Figure 3C:
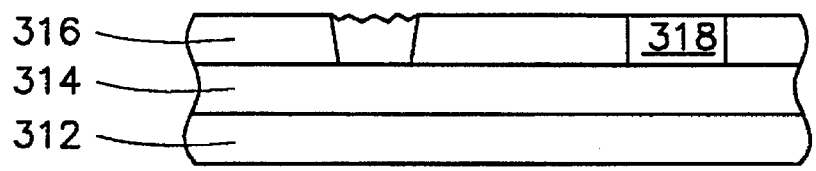
FIG. 3c is a cross-sectional view of the semiconductor device of FIG. 3, after polishing.

FIG. 3c shows the device 300 after polishing, according to yet another embodiment of the invention. In this embodiment, the passivation layer 330, the second metal layer 326, the intermetal dielectric film 322 and the first metal layer 320, in other words all of the upper layers, have been stripped (polished back) to the level of the BPSG layer 316. In this example, the tungsten plug 318 is exposed, but with most common polishing slurries (e.g., Cabot Industries Type SC-1) the tungsten will not be attacked.

Evidently, it is possible to polish back all the way to the contact level. In any case, the device 300 was substantially completely manufactured prior to polish back for repair. It is also possible that the polishing back technique could be applied at a somewhat earlier step, such as after deposition of first metal. By "substantially complete", it is meant that the fabrication of the device has proceeded to at least deposition of first metal.

Having thus described various applications for polishing semiconductor devices, there are set forth some exemplary polishing media.

EXAMPLE 1

In this example, a medium of aluminum oxide particles having the following characteristics is employed for polishing a semiconductor substrate: "X"=50 nm; "P"=50%; and "Z"=50%, and is used for chem-mech polishing, such as is set forth in any of the exemplary applications for chem-mech polishing (see Figures).

EXAMPLE 2

In this example, a medium of aluminum oxide particles having the following characteristics is employed for polishing a semiconductor substrate: "X"=50 nm; "Z"=50%; and "Q"=100, and is used for chem-mech polishing, such as is set forth in any of the exemplary applications for chem-mech polishing (see Figures).

EXAMPLE 3

In this example, a medium of aluminum oxide particles having the following characteristics is employed for polishing a semiconductor substrate: "X"=10 nm; "P"=10%; and "Z"=90%, and is used for chem-mech polishing, such as is set forth in any of the exemplary applications for chem-mech polishing (see Figures).

EXAMPLE 4

In this example, a medium of aluminum oxide particles having the following characteristics is employed for polishing a semiconductor substrate: "X"=10 nm; "Z"=90%; and "Q"=1000, and is used for chem-mech polishing, such as is set forth in any of the exemplary applications for chem-mech polishing (see Figures).

EXAMPLE 5

As mentioned hereinabove, other phases of aluminum oxide, as well as silica, especially amorphous silica, can be substituted for the alpha phase, according to any of the previous examples.

What is claimed is:

1. A method of removing excess material from an in-process semiconductor layer, comprising the steps of:

providing an in-process semiconductor device having a layer with excess material;

providing a polishing medium, the medium comprising a plurality of aluminum oxide particles having a size "X", a size distribution "Y", and an alpha phase percentage "Z", wherein "X" is 10–100 nm, "Y" is "P" percent of "X", where "P" is at most 50%, and "Z" is at least 50%;

providing a polishing pad;

positioning the polishing pad proximate to the layer with excess material, the polishing medium therebetween; and polishing the layer with the polishing pad and the polishing medium until the excess material has been substantially removed and the layer substantially planarized.

2. The method according to claim 1, wherein:

"X"=50 nm;

"P"=50%, wherein "Y"=25 nm; and

"Z"=50%.

3. The method according to claim 1, wherein:

"X"=10 nm;

"P"=10%, wherein "Y"=1 nm; and

"Z"=90%.

4. The method according to claim 1, wherein the excess material layer is a thermal oxide, and the polishing medium has a pH in the range of 10.5 to 11.

5. The method according to claim 1, wherein the excess material layer is a metal, and the polishing medium has a pH in the range of 3.0 to 3.5.

6. The method according to claim 5, wherein the polishing medium is acidified to a pH in the range of 3.0 to 3.5 using glacial acetic acid.

7. The method according to claim 5, wherein the metal is aluminum, and the polishing medium is acidified to a pH in the range of 3.0 to 3.5 using zinc sulfate.

8. The method according to claim 6, wherein the metal is aluminum, and the polishing medium is further acidified to a pH in the range of 3.0 to 3.5 using alum.

9. A method of stripping at least one layer from a substantially completed semiconductor device, comprising the steps of:

providing a substantially completed semiconductor device having a face with at least one layer thereon;

functionally testing the substantially completed semiconductor device;

identifying at least one defective layer in the substantially completed semiconductor device;

providing a polishing medium, the medium comprising a plurality of aluminum oxide particles having a size "X", a size distribution "Y", and an alpha phase percentage "Z", wherein "X" is 10–100 nm, "Y" is "P" percent of "X", where "P" is at most 50%, and "Z" is at least 50%;

providing a polishing pad;

positioning the polishing pad proximate to the face with at least one layer thereon; and stripping the at least one layer from the face of the substantially completed semiconductor device until the at least one defective layer is substantially exposed and planarized.

10. The method according to claim 9, further comprising the steps of:

repairing the defective layer; and remanufacturing the at least one layer stripped from the substantially completed semiconductor device.

11. The method according to claim 9, further comprising the steps of:

stripping the at least one defective layer from the substantially completed semiconductor device until the at least one defective layer is substantially removed and the underlying layer substantially planarized; and remanufacturing the at least one layer stripped from the substantially completed semiconductor device.

12. The method according to claim 9, wherein the at least one layer comprises alternating conductive and insulating layers.

13. The method according to claim 9, wherein:

"X"=50 nm;

"P"=50%, wherein "Y"=25 nm; and

"Z"=50%.

14. The method according to claim 9, wherein:

"X"=10 nm;

"P"=10%, wherein "Y"=1 nm; and

"Z"=90%.

15. The method according to claim 9, wherein the at least one layer is a thermal oxide, and the polishing medium has a pH in the range of 10.5 to 11.

16. The method according to claim 9, wherein the at least one layer is a metal, and the polishing medium has a pH in the range of 3.0 to 3.5.

17. The method according to claim 16, wherein the polishing medium is acidified to a pH in the range of 3.0 to 3.5 using glacial acetic acid.

18. The method according to claim 16, wherein the metal is aluminum, and the polishing medium is acidified to a pH in the range of 3.0 to 3.5 using zinc sulfate.

19. The method according to claim 17 wherein the metal is aluminum, and the polishing medium is further acidified to a pH in the range of 3.0 to 3.5 using alum.

* * * * *